(12) United States Patent
Habuka et al.

(10) Patent No.: US 6,309,458 B1
(45) Date of Patent: Oct. 30, 2001

(54) METHOD FOR FABRICATING SILICON THIN FILM

(75) Inventors: Hitoshi Habuka; Shoji Akiyama; Toru Otsuka, all of Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/267,696

(22) Filed: Mar. 15, 1999

(30) Foreign Application Priority Data

Mar. 23, 1998 (JP) .................................. 10-093988

(51) Int. Cl.$^7$ .................................................. C30B 25/14
(52) U.S. Cl. .................. 117/93; 117/88; 117/93; 117/102
(58) Field of Search ................................ 117/88, 89, 94, 117/93, 102

(56) References Cited

U.S. PATENT DOCUMENTS

| | | | |
|---|---|---|---|
| 4,081,313 | * | 3/1978 | McNeilly et al. .................... 156/610 |
| 4,496,609 | * | 1/1985 | McNeilly et al. ..................... 427/55 |
| 4,632,058 | * | 12/1986 | Dixon et al. ......................... 118/725 |
| 5,093,149 | * | 3/1992 | Doehler et al. ........................ 427/38 |
| 5,096,534 | * | 3/1992 | Ozias .................................... 156/611 |
| 5,261,960 | * | 11/1993 | Ozias .................................... 118/719 |
| 5,458,918 | * | 10/1995 | Hawkins et al. .................. 427/248.1 |
| 5,525,157 | * | 6/1996 | Hawkins et al. ..................... 118/715 |
| 5,899,752 | * | 5/1999 | Hey et al. ............................. 438/791 |
| 6,001,175 | * | 12/1999 | Maruyama et al. .................. 117/102 |

OTHER PUBLICATIONS

Wolf et al., Silicon Processing for the VLSI Era, vol. 1: Process Technology, Lattice Press, Sunset Beach, CA, pp. 142–143, 166–170, 1986.*

Nishizawa et al. Journal of Crystal Growth, Mechanism of Chemical Vapor Deposition of Silicon, vol. 52, pp. 213–218, 1981.*

Wolf et al., Silicon Processing for the VLSI Era vol. 1: Process Technology, Latice Press, Sunset Beach, CA, USA, pp. 124–143, 166–170, 1986.*

Nishizawa, J., Mechanism of Chemical Vapor Deposition of Silicon Journal of Crystal Growth 52, North–Holland Publishing Co. 1pp. 213–218, 1981.

* cited by examiner

*Primary Examiner*—Robert Kunemund
*Assistant Examiner*—Matthew Anderson
(74) *Attorney, Agent, or Firm*—Snider & Associates; Ronald R. Snider

(57) ABSTRACT

This invention provides a method for fabricating a silicon thin film which is high in supply efficiency of silicon material. In the method for fabricating a silicon thin film by placing a silicon semiconductor single crystal substrate in a process vessel and by supplying a silicon material into the process vessel, a wall of the process vessel is cooled so that silicon tetrachloride ($SiCl_4$) concentration in an exhaust gas discharged from the process vessel during a growth process of a silicon thin film becomes equal to or lower than $\frac{1}{10}$ of a concentration of the silicon material in the exhaust gas. Also, the wall of the process vessel is cooled so that temperature gradient between a surface of the semiconductor single crystal substrate and the wall of the process vessel satisfies the following Equation (1) in relation to a temperature of the semiconductor single crystal substrate:

$$\text{temperature gradient(K/cm)} \geq 0.3 \times \text{substrate temperature(K)} - 90 \quad (1).$$

10 Claims, 5 Drawing Sheets

F I G. 6
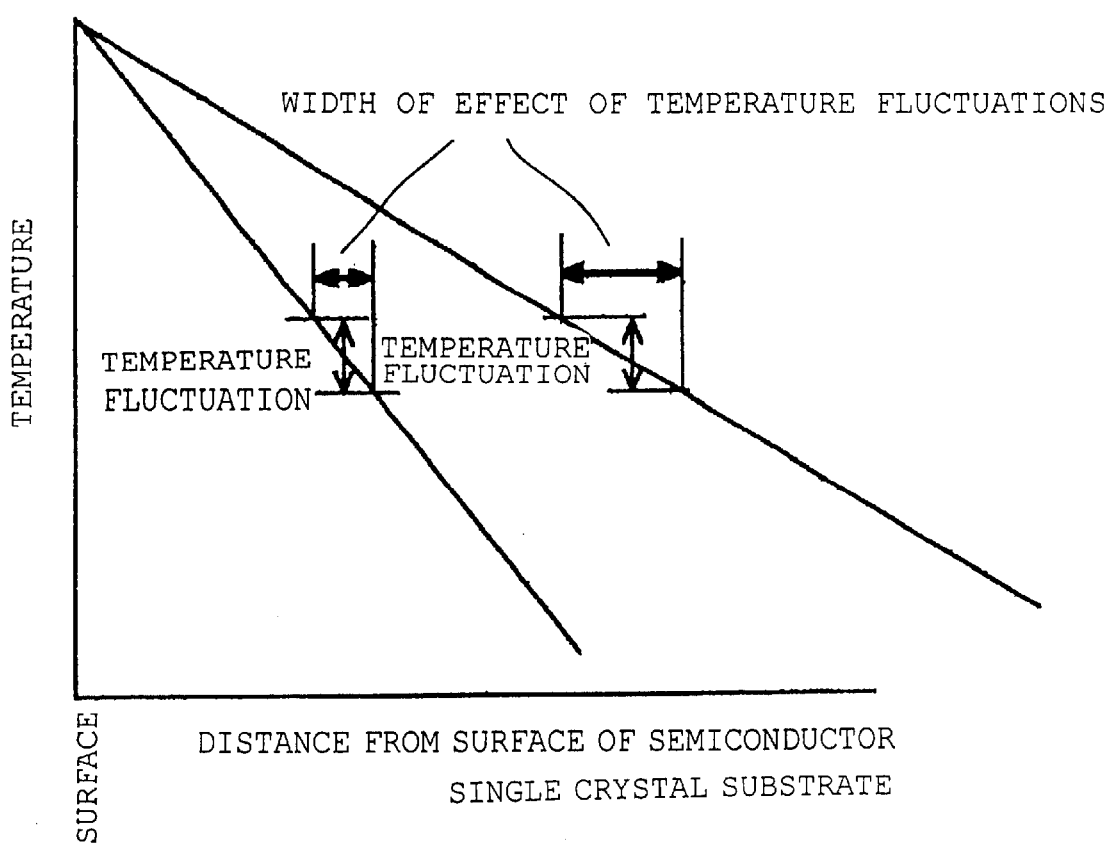

//METHOD FOR FABRICATING SILICON THIN FILM

RELATED APPLICATION

This application claims the priority of Japanese Patent Application No. 10-93988 filed on Mar. 23, 1998, which is incorporated herein by reference.

BACKGROUND OF THE INVENTION

This invention relates to a method for growing a silicon thin film on a semiconductor single crystal substrate.

As the method for growing a silicon thin film on a semiconductor single crystal substrate, there has been used a method in which with a silicon raw material gas supplied, a silicon thin film is grown on a semiconductor single crystal substrate by a vapor phase growth process.

FIG. 1 shows an example of the apparatus for fabricating silicon thin films. For forming a silicon thin film with this apparatus, a semiconductor single crystal substrate 1 such as a silicon semiconductor single crystal substrate is placed in a process vessel (reaction vessel) 10 made of quartz glass or the like, and infrared light is irradiated to the semiconductor single crystal substrate 1 by energizing an infrared lamp 11 provided outside the process vessel 10, so that the temperature of the semiconductor single crystal substrate 1 is increased to a desired temperature, for example, 950° C. or 1000° C. Then, a silicon raw material gas 3 given by a dilution gas such as hydrogen gas diluted with trichlorosilane ($SiHCl_3$) or the like is introduced through a gas inlet 12, by which a silicon thin film such as a silicon single crystal thin film or the like is grown on a surface of the semiconductor single crystal substrate 1 maintained at the high temperature. Also, for adjustment of the resistivity of the silicon thin film, diborane gas ($B_2H_6$) or phosphine gas ($PH_3$) or the like is introduced together. As the silicon material, dichlorosilane ($SiH_2Cl_2$) or silicon tetrachloride ($SiCl_4$) may be used, in some cases, instead of trichlorosilane ($SiHCl_3$).

In addition, for prevention of silicon deposition on the wall of the process vessel 10 due to the reaction of the silicon material, the temperature of the wall of the process vessel 10 is controlled by absorbing heat from the process vessel 10 by making a flow of a coolant 4 such as low-temperature air or nitrogen gas. The temperature of the semiconductor single crystal substrate 1 is measured, for example, by a radiation thermometer 2 provided outside the process vessel 10.

It has conventionally been known that, in the method for growing a silicon thin film by supplying a silicon raw material gas formed by diluting hydrogen gas with trichlorosilane ($SiHCl_3$) as described above, trichlorosilane ($SiHCl_3$) decomposes into $SiCl_2$ in vapor phase, which is an important reaction intermediate that accelerates the principal chemical reaction in the growth of the silicon thin film. Further, it has also been reported that silicon tetrachloride ($SiCl_4$) is generated in association with this reaction (for example, J. Nishizawa and M. Saito, J. Crystal growth, Vol. 52, pp. 213–218, 1981).

Silicon tetrachloride ($SiCl_4$), which, once formed, is relatively stabler to heat than trichlorosilane ($SiHCl_3$), decreases in the rate of contribution to the formation of the silicon thin film, which has been a cause of reducing the supply efficiency of the silicon material. Also, silicon tetrachloride ($SiCl_4$) yields large numbers of hydrogen chloride molecules each time one silicon atom from one molecule thereof is contributed to the growth of the silicon thin film, which has been a cause of undesirable results such as the formation of small voids at the surface of the silicon thin film.

Therefore, an object of the invention is to provide a method for fabricating a silicon thin film with a high supply efficiency of silicon material.

SUMMARY OF THE INVENTION

In order to achieve the above object, the inventors have made investigations and researches based on results of basic experiments, having reached the following invention.

In order to achieve the above object, the invention provides a method for fabricating a silicon thin film on a semiconductor single crystal substrate by placing the semiconductor single crystal substrate in a process vessel and by supplying a silicon material into the process vessel, characterized by comprising a step of cooling a wall of the process vessel so that silicon tetrachloride ($SiCl_4$) concentration in an exhaust gas discharged from the process vessel during a growth process of a silicon thin film becomes equal to or lower than $\frac{1}{10}$ of a concentration of the silicon material in the exhaust gas.

Preferably, the wall of the process vessel is cooled so that temperature gradient of a vapor phase between a surface of the semiconductor single crystal substrate and the wall of the process vessel satisfies the following Equation (1) in relation to a temperature of said semiconductor single crystal substrate:

$$\text{temperature gradient(K/cm)} \geq 0.3 \times \text{substrate temperature(K)} - 90 \quad (1).$$

Preferably, the temperature of the semiconductor single crystal substrate is equal to or higher than 800° C.

Preferably, the silicon material is trichlorosilane ($SiHCl_3$).

Preferably, the semiconductor single crystal substrate is a silicon semiconductor single crystal substrate and the silicon thin film is a silicon single crystal thin film.

In the method of the invention, the concentration of silicon tetrachloride ($SiCl_4$) is made equal to or lower than $\frac{1}{10}$ of the concentration of the supplied silicon material in the exhaust gas exhausted from the process vessel during the growth process of a silicon thin film in the process vessel, so that the supply efficiency of the silicon material is increased. Therefore, the growth rate of the silicon thin film can be improved even though the supply amount of the silicon material is the same as the conventional one.

In an embodiment of the invention, by increasing the heightwise temperature gradient on above the semiconductor single crystal substrate, chemical reaction in the vapor phase in regions separate away from the surface of the semiconductor single crystal substrate can be suppressed so that any losses of trichlorosilane ($SiHCl_3$) or the like due to the generation of silicon tetrachloride ($SiCl_4$) can be suppressed. Also, since the region where $SiCl_2$ is generated in the vapor phase can be limited to a region in close proximity to the surface of the semiconductor single crystal substrate, dissipation of $SiCl_2$ into the vapor phase separate away from the surface of the semiconductor single crystal substrate can be suppressed. Accordingly, the supply efficiency of the silicon material can be improved.

In an embodiment of the invention, by making the temperature of the semiconductor single crystal substrate equal to or higher than 800° C. and by making the temperature gradient satisfying the above Equation (1), generation of silicon tetrachloride ($SiCl_4$) and dissipation of $SiCl_2$ can be prevented without lowering the reaction efficiency of chemical reaction just above the surface of the semiconductor single crystal substrate.

BRIEF DESCRIPTION OF THE DRAWINGS

FIG. 6 is a graph showing the relationship between temperature fluctuations and width of the region where chemical reaction is affected by the temperature fluctuations.

DESCRIPTION OF THE INVENTION AND PREFERRED EMBODIMENT THEREOF

An embodiment of the invention will now be described with reference to the accompanying drawings.

Figure 1:
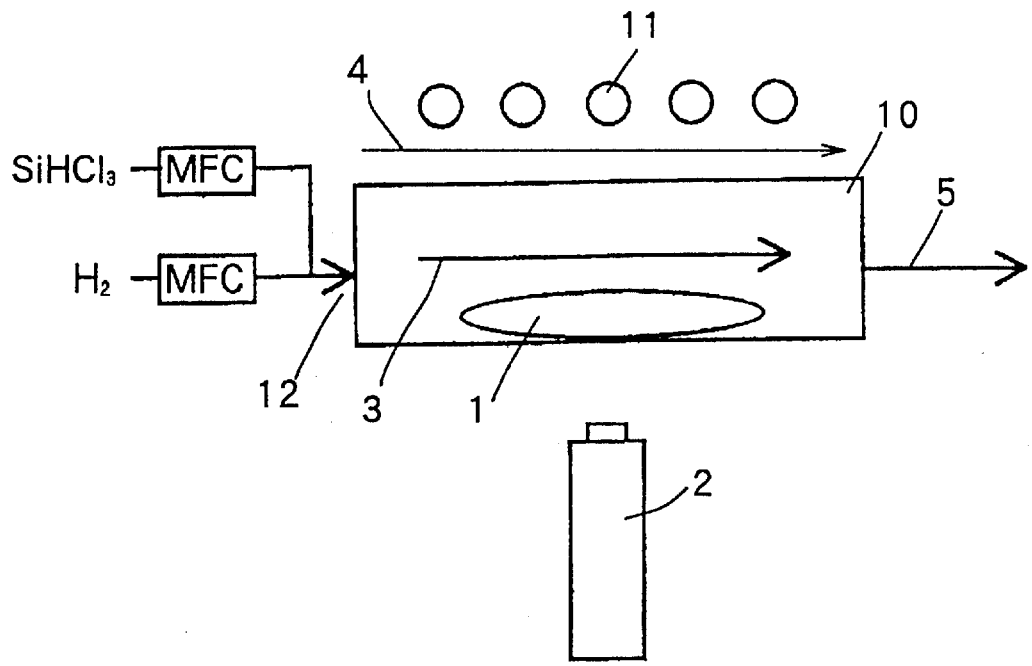
FIG. 1 is a schematic arrangement view showing an example of the silicon thin film fabricating apparatus.

The growth of a silicon thin film is carried out according to the aforementioned steps with the use of the apparatus shown in FIG. 1. Here is described an embodiment in which a silicon single crystal thin film is grown by supplying onto a silicon semiconductor single crystal substrate 1 a silicon raw material gas 3 formed by diluting hydrogen gas with trichlorosilane ($SiHCl_3$), which is a silicon material. First, interior of a process vessel 10 is filled with an inactive gas such as nitrogen gas until a stable state is formed, and then with the process vessel 10 opened, the silicon semiconductor single crystal substrate 1 is loaded into the process vessel 10 to be placed at a specified position. Next, hydrogen gas, which is a reaction atmosphere gas for the growth of a silicon thin film, is introduced into the process vessel 10. Then, temperature of the silicon semiconductor single crystal substrate 1 is increased to a desired temperature by energizing the infrared lamp 11, followed by awaiting for the temperature to be stabilized.

Before the silicon thin film is grown, natural oxide or the like that has unavoidably been deposited on the surface of the silicon semiconductor single crystal substrate 1 is removed. For this purpose, available are a method of attaining reductive decomposition and removal by heating in, for example, a hydrogen gas atmosphere, a method of removing the natural oxide by using hydrogen fluoride gas at room temperature and thereafter removing organic contaminations by using hydrogen chloride gas at around 700° C., and the like.

Next, during the process of growth of a silicon single crystal thin film, trichlorosilane ($SiHCl_3$) gas, which is the growth material of the silicon single crystal thin film, is introduced into the process vessel 10. This trichlorosilane ($SiHCl_3$) gas has been prepared through the steps of making a mixed gas of a certain concentration by bubbling hydrogen gas in liquid trichlorosilane ($SiHCl_3$), and by further diluting the mixed gas with a desired flow rate of hydrogen gas to thereby control the concentration of the trichlorosilane ($SiHCl_3$). The trichlorosilane ($SiHCl_3$) gas introduced into the process vessel 10 causes a chemical reaction that silicon atoms are bonded to the surface of the silicon semiconductor single crystal substrate 1 that has been maintained at high temperature, by which a silicon single crystal thin film is grown.

After the silicon single crystal thin film has been grown for a specified time, the supply of the trichlorosilane ($SiHCl_3$) gas is ended and the trichlorosilane ($SiHCl_3$) gas is discharged sufficiently from within the process vessel 10 by means of hydrogen gas. Then, the temperature is lowered by controlling the amount of conducting current of the infrared lamp 11. Next, an inactive gas such as nitrogen gas is introduced into the process vessel 10 so that the hydrogen gas is discharged, and thereafter with the process vessel 10 opened, the silicon semiconductor single crystal substrate 1 on which a silicon single crystal thin film has been formed is taken out.

Figure 2:
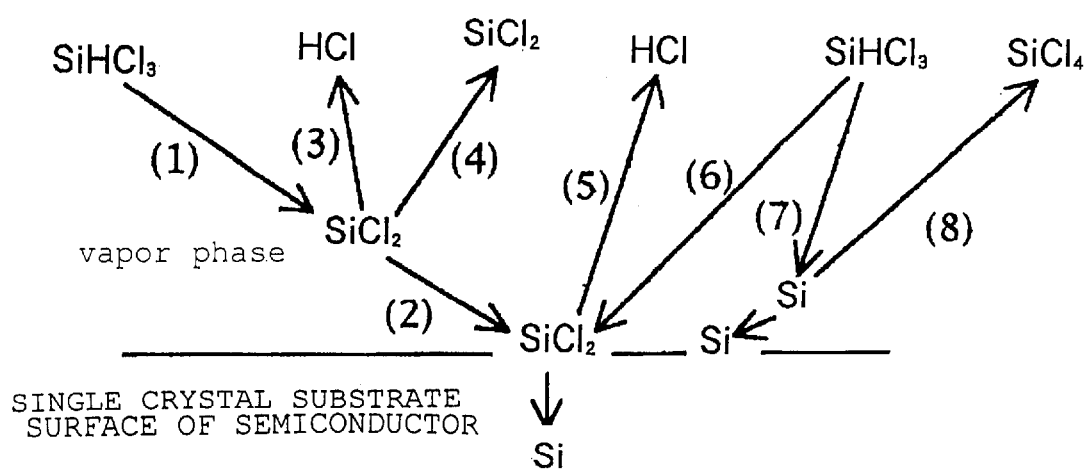
FIG. 2 is an explanatory view showing how chemical reaction progresses in the silicon thin film growth process.

FIG. 2 shows how chemical reaction proceeds in the above process for growth of a silicon single crystal thin film. The trichlorosilane ($SiHCl_3$) introduced into the process vessel 10 through a gas inlet 12 releases hydrogen chloride molecules in the vapor phase, making $SiCl_2$ (steps (1), (3)). $SiCl_2$ is carried onto the surface of the silicon semiconductor single crystal substrate 1 and chemically adsorbed to the surface thereof (step (2)), reacts with hydrogen molecules of the reaction atmosphere to release hydrogen chloride molecules (step (5)), resulting in silicon atoms. In this way, a silicon single crystal thin film is grown on the surface of the silicon semiconductor single crystal substrate 1.

$SiCl_2$ that has been generated in the vapor phase is diffused into regions of lower concentrations of $SiCl_2$ according to Fick's law, and transported. This transportation is done not only to the surface of the silicon semiconductor single crystal substrate 1 but also into the low-temperature vapor phase separate away from the silicon semiconductor single crystal substrate 1 (step (4)). This step (4) is a transportation that $SiCl_2$, which is an important reaction intermediate in the growth of a silicon single crystal thin film, separates away from the surface of the silicon semiconductor single crystal substrate 1, meaning a loss of the reaction intermediate necessary for the growth of a silicon single crystal thin film. That is, the transportation causes a reduction in the growth rate of the silicon single crystal thin film.

Also, trichlorosilane ($SiHCl_3$) molecules that are unreacted in the vapor phase reach the surface of the silicon semiconductor single crystal substrate 1 as it is (step (6)), and after releasing HCl molecules, are chemically adsorbed to the surface of the silicon semiconductor single crystal substrate 1 as $SiCl_2$. After that, the step of reacting with hydrogen molecules to yield silicon is in common with the step (5) described above.

Meanwhile, for example, as clarified by Nishizawa et al. described above, it is known that a chemical reaction (steps (7), (8)) that silicon tetrachloride ($SiCl_4$) and silicon (Si) are generated by disproportion reaction of trichlorosilane ($SiHCl_3$) proceeds in the vapor phase. Issues due to this silicon tetrachloride ($SiCl_4$) gas are as described before.

Figure 3:
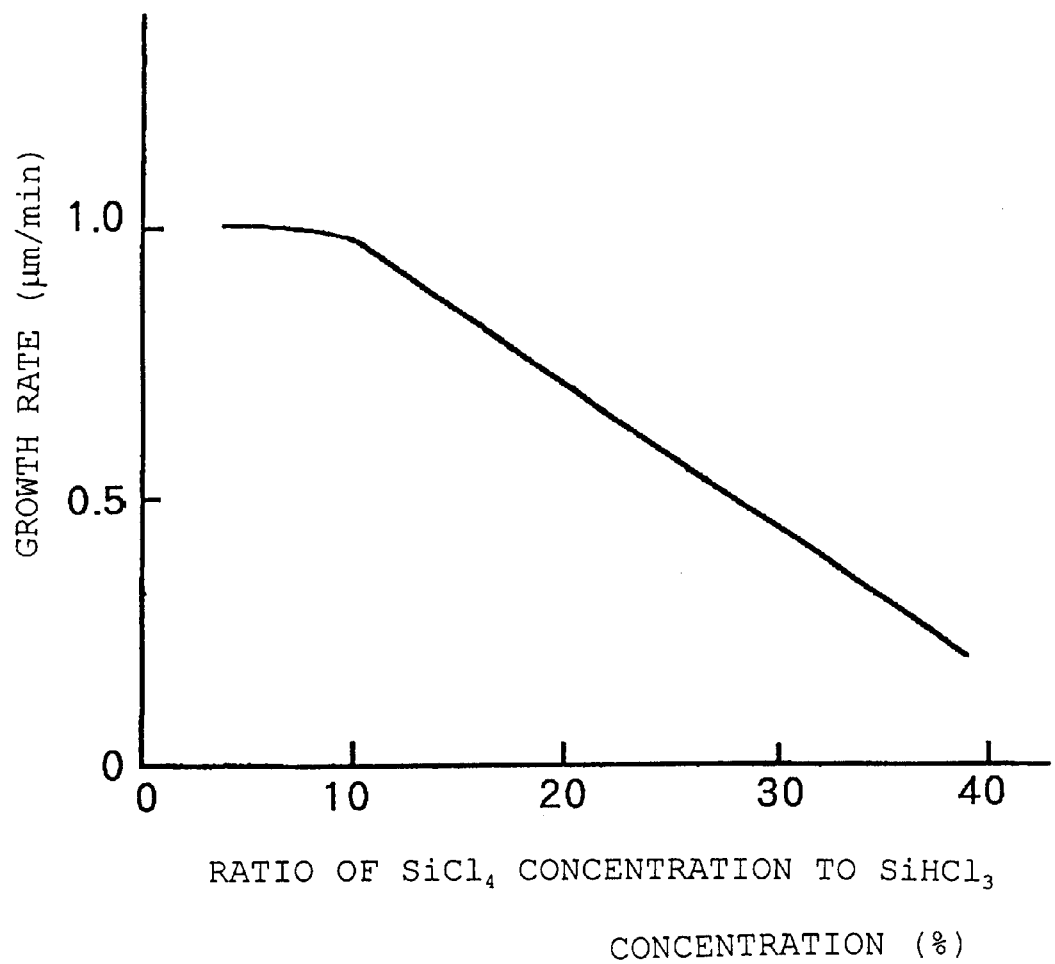
FIG. 3 is a graph showing the relationship between the ratio of silicon tetrachloride ($SiCl_4$) concentration to trichlorosilane ($SiHCl_3$) concentration in the exhaust gas, and the growth rate of a silicon single crystal thin film.

The inventors, focusing on the ratio of silicon tetrachloride ($SiCl_4$) concentration to trichlorosilane ($SiHCl_3$) concentration in the exhaust gas exhausted from the process vessel 10 during the process of growth of a silicon single crystal thin film, researched the relationship between this ratio and the growth rate of a silicon single crystal thin film. FIG. 3 shows results of the research. As can be seen from the figure, as the ratio of silicon tetrachloride ($SiCl_4$) concentration to trichlorosilane ($SiHCl_3$) concentration increases, the growth rate of a silicon single crystal thin film decreases. However, it has also been verified that if the ratio of silicon tetrachloride ($SiCl_4$) is not higher than 1/10, the growth rate scarcely decreases. That is, it has been found that because the composition in the exhaust gas reflects the reaction atmosphere to some extent, controlling this composition makes it possible to indirectly control the reaction atmosphere and thereby suppress the generation of silicon tetrachloride ($SiCl_4$).

Consequently, with the arrangement that the silicon tetrachloride ($SiCl_4$) concentration in the exhaust gas discharged from the process vessel 10 during the process of growth of a silicon single crystal thin film within the process vessel 10 is made equal to or lower than $\frac{1}{10}$ of the trichlorosilane ($SiHCl_3$) concentration also in the exhaust gas, the aforementioned problems due to silicon tetrachloride ($SiCl_4$) no longer occur almost at all, so that the reaction efficiency can be improved. Therefore, the growth rate of the silicon single crystal thin film can be improved over the conventional counterpart.

The above ratio of silicon tetrachloride ($SiCl_4$) in the exhaust gas can be realized by maintaining the vapor phase temperature of the regions separate away from the silicon semiconductor single crystal substrate 1 within the process vessel 10 low. For this purpose, a flow of the coolant 4 is given outside the process vessel 10, by which the temperature of the wall of the process vessel 10 is controlled.

Also, the inventors have found that the ratio of silicon tetrachloride ($SiCl_4$) in the exhaust gas can be made equal to or lower than $\frac{1}{10}$ by increasing the rate of temperature decrease, i.e. increasing the temperature gradient of the vapor phase, from the silicon semiconductor single crystal substrate 1 toward the wall of the process vessel 10 without changing the temperature of the silicon semiconductor single crystal substrate 1. Then, it was clarified as a result of experiments that conditions that give a necessary temperature gradient can be expressed by the following Equation (1):

$$\text{temperature gradient}(K/cm) \geq 0.3 \times \text{substrate temperature}(K) - 90 \quad (1)$$

where if the temperatures of the silicon semiconductor single crystal substrate 1 and the wall of the process vessel 10 are known, then the temperature gradient can be determined by the following Equation (2):

$$\text{temperature gradient (K./cm)} = \frac{\text{substrate temperature (K.)} - \text{process vessel temperature (K.)}}{\text{distance between substrate and process vessel (cm)}} \quad (2)$$

Figure 4:
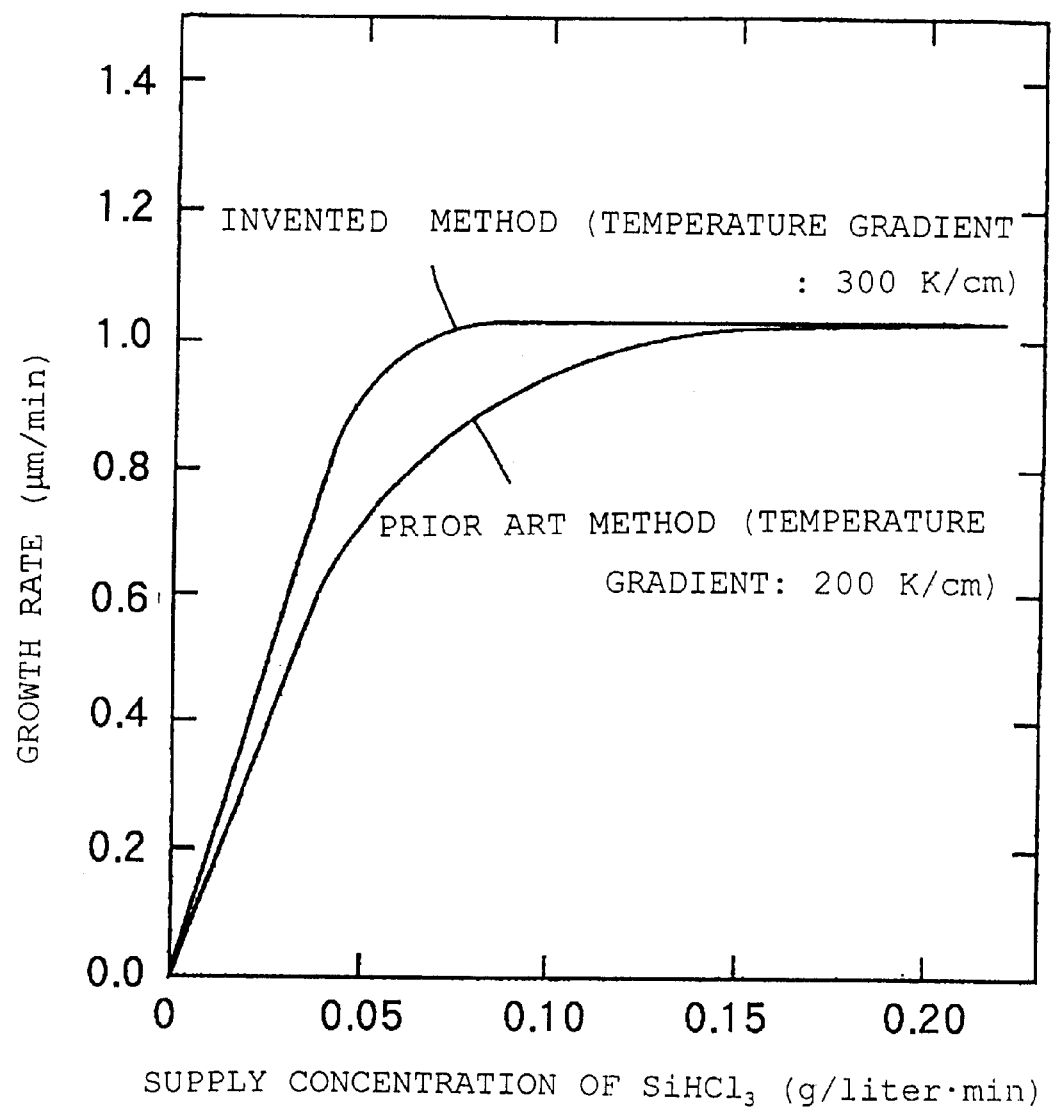
FIG. 4 is a graph showing the growth rate of a silicon single crystal thin film relative to the supply concentration of $SiHCl_3$ at temperature gradients of 300 K/cm and 200 K/cm.

For example, if the substrate temperature is 950° C. (1223K), then Equation (1) shows a condition that the required temperature gradient is 276.9 K/cm or more. Thus, while the concentration of trichlorosilane ($SiHCl_3$) gas supplied to the process vessel 10 at 950° C. is changed, growth rate was compared between a case of a temperature gradient of 300 K/cm that satisfies the condition of Equation (1) and another case of a temperature gradient of 200 K/cm that is lower than 276.9 K/cm, which is the lower limit of the condition of Equation (1). FIG. 4 shows results of the comparison. With the temperature gradient of 300 K/cm, a higher growth rate can be obtained than that of the temperature gradient of 200 K/cm. In particular, it is apparent that the above condition is more effective for cases of low concentrations of trichlorosilane ($SiHCl_3$) not higher than 0.15 g/liter·min.

Figure 5:
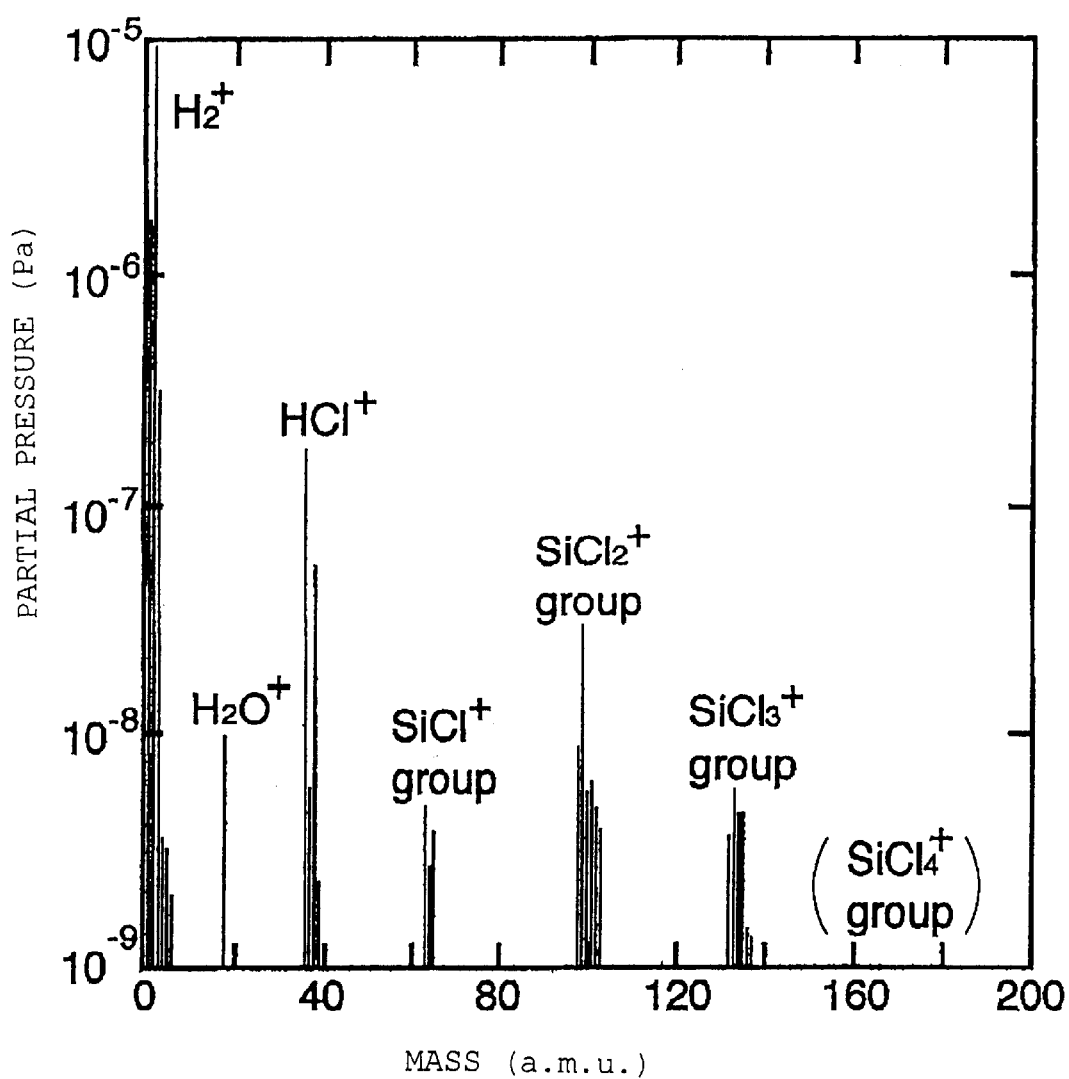
FIG. 5 is a graph showing results of analyzing components of the exhaust gas.

FIG. 5 shows results of analyzing components of exhaust gas discharged from the process vessel 10 with a quadrupole mass spectrometer when a silicon single crystal thin film was grown on the silicon semiconductor single crystal substrate 1 under normal pressure by using trichlorosilane ($SiHCl_3$) gas at a temperature gradient of 300 K/cm that satisfies the condition shown in Equation (1), with the temperature of the silicon semiconductor single crystal substrate 1 at 950° C. Detected chemical species are, in the ascending order of mass, a group ($H_2^+$) in which hydrogen gas molecules were ionized, a group ($H_2O^+$) in which $H_2O$ molecules remaining in discharge piping derived from the process vessel were ionized, a group ($HCl^+$) in which hydrogen chloride molecules were ionized, a group ($SiCl^+$) in which $SiCl_2$ molecules were ionized, a group ($SiCl_2^+$) in which $SiCl_2$ and trichlorosilane ($SiHCl_3$) molecules were ionized, and a group ($SiCl_3^+$) in which trichlorosilane ($SiHCl_3$) molecules were ionized. On the other hand, presence of chemical species was not detected at all in the mass in which a group ($SiCl_4^+$) with silicon tetrachloride ($SiCl_4$) molecules ionized appeared.

Next, as a result of performing an analysis similar to the above at a temperature gradient of 276.9 K/cm, which is the lower limit of the condition shown in Equation (1), a group ($SiCl_4^+$) in which silicon tetrachloride ($SiCl_4$) molecules were ionized was observed in a quantity about $\frac{1}{10}$ of the group ($SiCl_3^+$) in which trichlorosilane ($SiHCl_3$) molecules were ionized. Also, at a temperature gradient of 200 K/cm lower than 276.9 K/cm, which is the lower limit of the condition shown in Equation (1), the group ($SiCl_4^+$) in which silicon tetrachloride ($SiCl_4$) molecules were ionized was observed in a quantity about $\frac{1}{5}$ of the group ($SiCl_3^+$) in which trichlorosilane ($SiHCl_3$) molecules were ionized.

Accordingly, cooling the wall of the process vessel 10 so that the temperature gradient satisfies Equation (1) allows the silicon tetrachloride ($SiCl_4$) concentration in the exhaust gas to be equal to or lower than $\frac{1}{10}$ of the trichlorosilane ($SiHCl_3$) concentration.

In addition, the lower the substrate temperature is, the more the generation of silicon tetrachloride ($SiCl_4$) is suppressed. However, because growth reaction of a silicon single crystal thin film no longer occurs when the vapor phase temperature just above the surface of the silicon semiconductor single crystal substrate 1 becomes lower than 800° C., it is preferable that the temperature of the silicon semiconductor single crystal substrate 1 is not lower than 800° C. and that the wall of the process vessel 10 is cooled so that the temperature gradient satisfies the above Equation (1).

When the growth material, $SiCl_2$, of the silicon single crystal thin film is formed in the vapor phase, there occurs a transportation (diffusion) to the lower-temperature side separate away from the surface of the silicon semiconductor single crystal substrate 1 in the vapor phase in addition to the transportation (diffusion) to the surface of the silicon semiconductor single crystal substrate 1, so that $SiCl_2$ is lost. As a result, the growth rate of the silicon single crystal thin film is lowered. This also makes a problem in addition to the generation of silicon tetrachloride ($SiCl_4$). For prevention of the loss of $SiCl_2$, it is important to implement the generation of $SiCl_2$ in a region as close to the surface of the silicon semiconductor single crystal as possible. Then, when the aforementioned temperature gradient is set so as to satisfy Equation (1), the temperature of the vapor phase separate away from the surface of the silicon semiconductor single crystal substrate 1 can be lowered, making it possible to implement the generation of $SiCl_2$ in a region as close to the surface of the silicon semiconductor single crystal as possible.

Also, in the present invention, in addition to the above-described effects, the formation of silicon nuclei in the vapor phase is suppressed and therefore the formation of silicon fine particles is suppressed. Thus, the formation of protrusions sized over a range of about 0.1 μm to a few tens of μm or larger at the surface of the silicon single crystal thin film (i.e., surface abnormality failures) is remarkably suppressed. Further, by using a large temperature gradient, the region where chemical reaction is affected by temperature fluctuations is narrowed in width as shown in FIG. 6, so that fluctuations of the growth rate of the silicon single crystal thin film is suppressed. As a result, minute thickness distribution within a 30 mm square range becomes extremely uniform. Similarly, by narrowing the effective range of temperature fluctuations of the vapor phase, there can be recognized effects also in the suppression of crystal deformation (slip dislocation) generating in the silicon semiconductor single crystal substrate 1 during heating process.

That the effective range of temperature fluctuations of the vapor phase is narrowed has a good influence also on the distribution of resistivity, secondarily, so that the distribution of resistivity also becomes uniform. Lowering the temperature of the vapor phase and lowering the temperature of the wall of the process vessel 10 leads to a capability of suppressing unexpected chemical reactions. That is, because corrosion of metallic portions such as stainless steel constituting part of the wall of the process vessel 10 is inevitably suppressed, the floating of metallic elements in the vapor phase due to corrosion reactions is suppressed. As a result, metallic elements, such as iron, nickel, molybdenum and copper, to be mixed in the silicon single crystal thin film can be lowered in concentration.

The inventors have been investigating the mechanism contributed by the invention, where suppression of surface defects such as shallow pits, improvement in gettering capability of metallic elements in the silicon semiconductor single crystal substrate, increase in the speed at which crystal defects of COP or the like are dissolved, and the like can be observed with good reproducibility. These could be considered to be attributed to the present invention.

As described above, according to the invention, the wall of the process vessel is cooled so that silicon tetrachloride ($SiCl_4$) concentration in the exhaust gas discharged from the process vessel during the growth process of a silicon thin film becomes equal to or lower than 1/10 of the silicon material concentration in the exhaust gas, by which chemical reaction in the vapor phase can be suppressed and loss of trichlorosilane ($SiHCl_3$) due to the generation of $SiCl_4$ can be suppressed. Accordingly, the reaction efficiency can be improved and the growth rate of the silicon thin film can be raised.

Also, particularly in an embodiment, by cooling the wall of the process vessel so that the temperature gradient between the surface of the semiconductor single crystal substrate and the wall of the process vessel satisfies the following Equation (1) in relation to the temperature of the semiconductor single crystal substrate:

temperature gradient(K/cm)≧0.3×substrate temperature(K)−90  (1)

the region where $SiCl_2$ is generated in the vapor phase can be limited to a region in close proximity to the surface of the semiconductor single crystal substrate, so that dissipation of $SiCl_2$ into the vapor phase of regions separate away from the surface of the semiconductor single crystal substrate can be suppressed. Accordingly, the supply efficiency of, for example, trichlorosilane ($SiHCl_3$) gas used for the growth of a silicon thin film can be improved and a high growth rate can be obtained.

It is noted that the invention is not limited to the above-described embodiment. For example, with regard limitedly to the setting of the temperature gradient, as a matter of course, by applying a similar concept, the invention can be applied to the growth of a silicon thin film using dichlorosilane ($SiH_2Cl_2$) gas. Further, the invention can also be applied to silicon polycrystalline thin films. Furthermore, the invention is effective for a wide range of pressure of the vapor phase ranging from normal pressure to reduced pressure.

What is claimed is:

1. A method for fabricating a silicon thin film on a semiconductor single crystal substrate by placing the semiconductor single crystal substrate in a process vessel and by supplying a silicon material into the process vessel, characterized by comprising a step of cooling a wall of the process vessel so that silicon tetrachloride ($SiCl_4$) concentration in an exhaust gas discharged from the process vessel during a growth process of a silicon thin film becomes equal to or lower than 1/10 of a concentration of the silicon material in the exhaust gas.

2. A method for fabricating a silicon thin film according to claim 1, wherein said semiconductor single crystal substrate is a silicon semiconductor single crystal substrate and said silicon thin film is a silicon single crystal thin film.

3. A method for fabricating a silicon thin film according to claim 1, wherein said silicon material is trichlorosilane ($SiHCl_3$).

4. A method for fabricating a silicon thin film according to claim 3, wherein said semiconductor single crystal substrate is a silicon semiconductor single crystal substrate and said silicon thin film is a silicon single crystal thin film.

5. A method for fabricating a silicon thin film according to claim 1, wherein said wall of the process vessel is cooled so that temperature gradient of a vapor phase between a surface of said semiconductor single crystal substrate and said wall of the process vessel satisfies the following Equation (1) in relation to a temperature of said semiconductor single crystal substrate:

temperature gradient(K/cm)≧0.3×substrate temperature(K)−90  (1).

6. A method for fabricating a silicon thin film according to claim 5, wherein said silicon material is trichlorosilane ($SiHCl_3$).

7. A method for fabricating a silicon thin film according to claim 5, wherein said semiconductor single crystal substrate is a silicon semiconductor single crystal substrate and said silicon thin film is a silicon single crystal thin film.

8. A method for fabricating a silicon thin film according to claim 5, wherein the temperature of said semiconductor single crystal substrate is equal to or higher than 800°0C.

9. A method for fabricating a silicon thin film according to claim 8, wherein said semiconductor single crystal substrate is a silicon semiconductor single crystal substrate and said silicon thin film is a silicon single crystal thin film.

10. A method for fabricating a silicon thin film according to claim 8, wherein said silicon material is trichlorosilane ($SiHCl_3$).

* * * * *